United States Patent
Gelso (10) Patent No.: US 11,146,078 B2
(45) Date of Patent: Oct. 12, 2021

(54) METHOD AND ARRANGEMENT FOR BALANCING A BATTERY PACK

(71) Applicant: VOLVO TRUCK CORPORATION, Gothenburg (SE)

(72) Inventor: Esteban Gelso, Gothenburg (SE)

(73) Assignee: VOLVO TRUCK CORPORATION, Gothenburg (SE)

(*) Notice: Subject to any disclaimer, the term of this patent is extended or adjusted under 35 U.S.C. 154(b) by 104 days.

(21) Appl. No.: 16/483,508

(22) PCT Filed: Feb. 21, 2017

(86) PCT No.: PCT/EP2017/053907
§ 371 (c)(1),
(2) Date: Aug. 5, 2019

(87) PCT Pub. No.: WO2018/153431
PCT Pub. Date: Aug. 30, 2018

(65) Prior Publication Data
US 2019/0372359 A1    Dec. 5, 2019

(51) Int. Cl.
*H02J 7/00* (2006.01)
*G01R 31/392* (2019.01)
*B60L 58/12* (2019.01)

(52) U.S. Cl.
CPC ............ *H02J 7/0019* (2013.01); *B60L 58/12* (2019.02); *G01R 31/392* (2019.01)

(58) Field of Classification Search
CPC .... H02J 7/0019; H02J 2310/48; H02J 7/0014; G01R 31/392; Y02T 10/70; Y02T 90/12;
(Continued)

(56) References Cited

U.S. PATENT DOCUMENTS

2011/0127960 A1   6/2011   Plett
2011/0166732 A1*   7/2011   Yu .................. B60W 10/26
                                                                          701/22

(Continued)

FOREIGN PATENT DOCUMENTS

JP    2010081731 A    4/2010
WO   2017008846 A1   1/2017

OTHER PUBLICATIONS

International Search Report dated Oct. 18, 2017 in International Application No. PCT/EP2017/053907.
(Continued)

*Primary Examiner* — Stacy Whitmore
(74) *Attorney, Agent, or Firm* — Venable LLP; Jeffri A. Kaminski (57) ABSTRACT

The invention relates to a method for balancing a battery pack (5) comprising a plurality of battery cells (5a, 5b, 5c) for an electric vehicle. The method comprises: determining the state of charge (SOC) for each of said battery cells (5a, 5b, 5c); receiving information related to the expected use of the electric vehicle to a prediction horizon; and determining a state of balance value ($SOB_c$) at the current time and an expected state of balance value ($SOB_p$) at the end of the prediction horizon. Furthermore, the method comprises balancing the battery cells (5a, 5b, 5c) based on the state of balance value ($SOB_c$) at the current time and the expected state of balance value ($SOB_p$) at the end of said prediction horizon, such that the state of balance (SOB) and the use of the cell balancing process is optimized so as to minimize the energy usage of the battery pack (5). The invention also relates to an arrangement for balancing a battery pack (5).

13 Claims, 4 Drawing Sheets

(58) Field of Classification Search
CPC ...... Y02T 10/7072; Y02T 90/14; B60L 53/64;
B60L 2240/547; B60L 2240/545; B60L
2200/18; B60L 2200/36; B60L 2200/40;
B60L 2200/22; B60L 58/12; B60L 58/22;
B60L 53/32; B60L 2240/549; B60Y
2200/14; B60Y 2200/41; B60Y 2200/11;
B60Y 2200/91
See application file for complete search history.

(56) References Cited

U.S. PATENT DOCUMENTS

| | | |
|---|---|---|
| 2012/0081075 A1* | 4/2012 | Skelton .................. H02J 7/005 320/116 |
| 2013/0099746 A1 | 4/2013 | Nork et al. |
| 2013/0167752 A1 | 7/2013 | Barbee et al. |
| 2014/0077752 A1 | 3/2014 | Barsukov et al. |
| 2014/0163789 A1* | 6/2014 | Yu ......................... B60W 10/06 701/22 |
| 2014/0197776 A1* | 7/2014 | Schlaupitz ............ H02J 7/0014 320/103 |
| 2014/0340022 A1* | 11/2014 | Kang .................... H02J 7/0014 320/103 |
| 2015/0097512 A1* | 4/2015 | Li .......................... B60L 58/13 320/101 |
| 2015/0191100 A1 | 7/2015 | Schindler |
| 2015/0239365 A1 | 8/2015 | Hyde et al. |
| 2017/0074945 A1* | 3/2017 | Gelso ................. G01R 31/3646 |
| 2018/0106869 A1* | 4/2018 | Gelso .............. G01R 19/16542 |

OTHER PUBLICATIONS

International Report on Patentability dated May 21, 2019 in International Application No. PCT/EP2017/053907.

* cited by examiner

METHOD AND ARRANGEMENT FOR BALANCING A BATTERY PACK

TECHNICAL FIELD

The invention relates to a method and arrangement for balancing a battery pack.

The invention can be applied in heavy-duty vehicles, such as buses, trucks and construction equipment, and also passenger cars. Although the invention will be described below with respect to a bus, the invention is not restricted to this particular vehicle, but may also be used in other vehicles.

BACKGROUND

In the automotive field, there is an increase in research and development related to propulsion of vehicles with alternative power sources, i.e. power sources being used as alternatives to conventional internal combustion engines. It is known that an internal combustion engine, for example a gasoline engine or a diesel engine, offers high efficiency with relatively low fuel consumption. However, environmental concerns have led to an increase in development of more environmental-friendly vehicles, in particular electrically operated vehicles.

Today, there exist various types of vehicle propulsion systems comprising electric machines. For example, a vehicle can be operated by means of an electric machine solely, i.e. in the form of a fully electric vehicle (EV), or by means of an arrangement comprising both an electric machine and an internal combustion engine. The latter alternative is often referred to as a hybrid vehicle (HEV), and can be utilized in a manner in which an internal combustion engine is used for operating the vehicle while driving outside urban areas whereas the electric machine can be used in urban areas or in environments in which there is a need to limit the discharge of harmful pollutants such as oxides of nitrogen, fossil carbon dioxide and carbon monoxide. A hybrid normally uses a rechargeable battery pack for supplying electric energy to the electric machine.

Furthermore, a vehicle which is operated by means of an internal combustion engine and an electric machine supplied with power from a battery pack which can be recharged by an external mains electricity supply is referred to as a plug-in hybrid electric vehicle (PHEV).

The technology involved in electrically operated vehicles is closely related to the development of electrical energy storage systems and battery-related technology for vehicles. Today's electrical energy storage systems for vehicles may comprise a battery pack with a plurality of rechargeable battery cells which, together with control circuits, form a system which is configured for providing electric power to an electric machine in a vehicle. The battery cells can be restored into a condition involving a full charge through a connection to an external electric power supply. The external power supply can be in the form of the common electric grid power system which can be accessed via a conventional power cord, or can be in the form of other charging arrangements depending on the vehicles involved and the power need for the recharging process.

During charging, a high amount of energy must be fed into the energy storage system in a relatively short time in order to optimize the vehicle's range of driving. For this reason, the actual charging of the energy storage system is suitably implemented through a process in which a control unit on the vehicle requests a charging process to be carried out by means of the external electric power supply. This is carried out after the energy storage system and the external power supply have been electrically connected by means of suitable connector elements.

In the automotive field, an energy storage system normally comprises a battery pack with a large number of battery cells. Using a plug-in hybrid vehicle as an example, a battery pack may for example be of the lithium-ion type. In the event that a 600 V lithium-ion battery pack is used, approximately 200 battery cells connected in series will then be needed to achieve a desired voltage in order to operate the vehicle. The available range for driving the vehicle then depends on certain parameters such as the state of charge (SOC) of the battery pack. The state of charge can be defined as the remaining electric capacity left in the battery pack at a certain point in time, i.e. it corresponds to a fuel gauge function in a vehicle with a combustion engine, and is an important parameter in order to prevent batteries from being operated during under- or over-charging situations, and to manage the energy in the vehicle in question in an optimal manner. The state of charge needs to be estimated since no direct measurement is available for this parameter.

According to previously known technology, there exist several ways of determining the state of charge (SOC) of a battery pack. For example, a first method relies on a voltage based state of charge estimation in which a voltage of a battery cell is used for calculating a state of charge value. A further method of determining a state of charge (SOC) value relies on a process of measuring an electric current passing through the battery pack. By integrating the electric current, a measurement of the charge which is drawn out of the battery pack can be obtained.

The battery pack is furthermore controlled by a battery management unit (BMU) which is configured to to maintain the battery pack in a proper operating conditions and in order to ensure a long working lifetime of the battery pack.

Furthermore, it is known that requirements for optimum battery properties can be met by means of a process referred to as battery cell balancing, or cell equalization. The reason is that the voltages of different battery cells in a battery pack will differ between cells during the course of time. This lack of balance between cells may result in degraded battery properties, which needs to be corrected through a cell balancing process.

Today, there exist several different methods for cell balancing. One such known method is to discharge a selected battery cell, which is found to have a cell voltage or state of charge (SOC) which differs considerably from the remaining battery cells, through a resistor which is coupled in parallel with the battery cell.

The patent document JP 2010/008173 teaches a method and arrangement for controlling a cell balancing process of a battery pack in a vehicle. The method comprises controlling the cell balancing depending on a state of charge at start of operation. Also, a state of charge at an ending time is determined based on route information for the vehicle in question.

Even though the document JP 2010/008173 teaches a system for balancing the cells of a battery pack, there is a problem in the form of a need to minimize leak currents, i.e. corresponding to a certain amount of power loss, from the battery pack during the cell balancing. In this manner, and by optimizing the cell balancing process, the general performance of the battery pack could be optimized.

SUMMARY

An object of the invention is to provide a improved method and arrangement by means of which a cell balancing process for a battery pack in a vehicle could be optimized.

The object is at least partly achieved by a method for balancing a battery pack comprising a plurality of battery cells for an electric vehicle; said method comprising: determining the state of charge (SOC) for each of said battery cells; receiving information related to the expected use of the electric vehicle to a prediction horizon; and determining a state of balance value at the current time and an expected state of balance value at the end of the prediction horizon. Furthermore, the method comprises: balancing the battery cells based on the state of balance value at the current time and the expected state of balance value at the end of said prediction horizon, such that the state of balance (SOB) and the use of the cell balancing process is optimized so as to minimize the energy usage of the battery pack.

By the provision of the above-mentioned method, an advantage is obtained in that a more accurate cell balancing can be obtained by using information related to the future energy usage of the battery cell in a vehicle. More precisely, by determining the future current drain from the battery pack, i.e. at the prediction horizon, a more efficient cell balancing can be obtained in which the state of balance (SOB) of the battery pack is improved.

The term "prediction horizon" refers to a future point in time during use of the vehicle in question. According to an embodiment, the prediction horizon is of the magnitude 30-60 minutes ahead of the present time, but the invention is not limited to such time scale only. In particular, the prediction can alternatively be relatively long, in the magnitude of a few hours' time, or relatively short, in the magnitude of 10-20 minutes.

According to one embodiment, the method comprises balancing said battery cells by means of controllable switches being associated with each battery cell, each switch being configured for connecting a resistor in parallel with each battery cell; and balancing said battery cells in a manner so as to optimize the use of the switches with regard to the power losses in said resistors during said balancing step.

In this manner, a reliable and efficient method for balancing the battery cells can be obtained.

According to an embodiment, the cell balancing comprises optimizing the use of the switches by minimizing the time during which the switches are activated, said time being equivalent to the power loss during the cell balancing. In this manner, an efficient optimization method for minimizing the total power loss of a battery cell during a cell balancing process is obtained.

According to an embodiment, the cell balancing comprises the steps of defining a control vector which indicates the state of a corresponding one of said switches; and optimizing said cell balancing by minimizing the power losses as a function of said control vector. In this manner, an optimizing method which can be implemented in an efficient manner in an electronic control unit of a vehicle can be achieved.

According to an embodiment, the cell balancing comprises the steps of defining said control vector with a number of components, each of which corresponds to one of said switches, wherein each of said components has a value between 0 and 1, being 0 when a switch is open and 1 when a switch is closed and wherein and a value between 0 and 1 indicates an average value of the positions of a corresponding switch during a certain time period. In this manner, an optimizing method which requires a relatively low amount of calculations in a control unit is obtained.

According to an embodiment, the cell balancing comprises a step of determining the state of charge (SOC) of the battery cells using at least measurements of the voltage of each cell, the battery pack current and the temperature of each cell. In this manner, a suitable way of determining the state of charge can be obtained by means of readily available measurement parameters in a battery pack of a vehicle.

According to an embodiment, the cell balancing comprises a step of balancing the battery cells based on also at least the cell capacity and the internal resistance of each battery cell. In this manner, a very high accuracy for determining the state of charge is obtained.

According to a second aspect, the above-mentioned object is also achieved by means of an arrangement for balancing a battery pack comprising a plurality of battery cells for an electric vehicle; said arrangement comprising a battery control unit configured for determining the state of charge for each of said battery cells, for receiving information related to the expected use of the electric vehicle to a prediction horizon, and for determining a state of balance value at the current time and an expected state of balance value at the end of the prediction horizon. Furthermore, the battery control unit is configured for balancing the battery cells based on the state of balance value at the current time and the expected state of balance value at the end of said prediction horizon, such that the state of balance and the use of the cell balancing process is optimized with regard to the energy usage of the battery pack.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Different embodiments of the present disclosure will be described more fully hereinafter with reference to the enclosed drawings. However, the method and system disclosed herein can be realized in many different forms and should not be construed as being limited to the aspects set forth herein.

Figure 1:
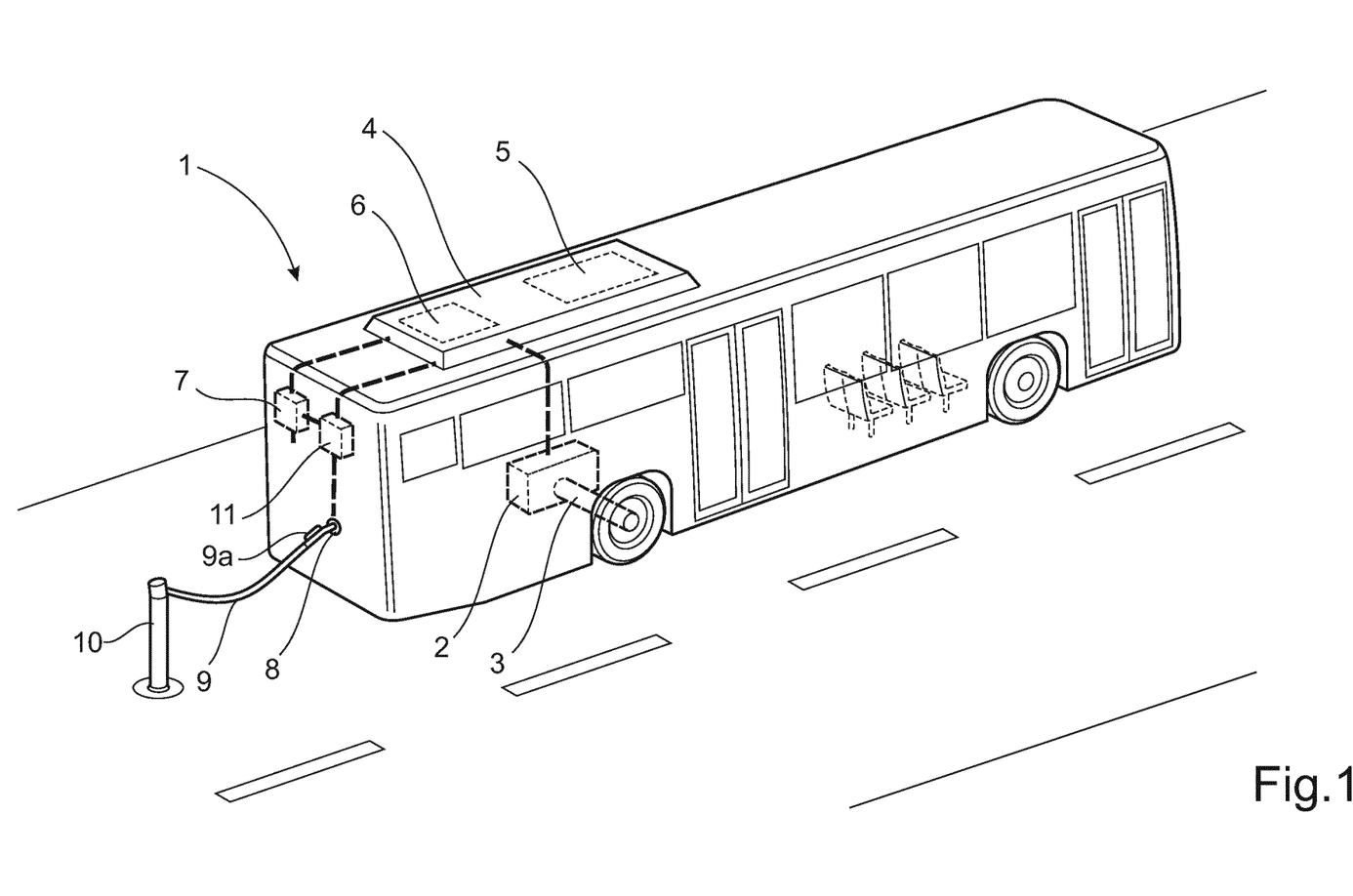
FIG. 1 is a perspective view of a hybrid vehicle in the form of a bus, in which the present invention can be used.

With initial reference to FIG. 1, there is shown a simplified perspective view of a vehicle in the form of a bus 1 which according to an embodiment is of the electric type which is equipped with an electric machine 2 for operating the bus 1. This is shown schematically in FIG. 1 by means of a rear axle 3 which is connected to the electric machine 2. The electric machine 2 is suitably operated as a combined generator and motor. Also, the vehicle 1 can be in the form of any commercial vehicle such as a truck or the like, or an automobile.

The bus 1 carries an electric energy storage system 4 comprising a battery pack 5 which will be described in greater detail below and which comprises a plurality of battery cells (not shown in detail in FIG. 1). As will be described in greater detail below, the battery cells are connected in series to provide an output DC voltage having a desired voltage level. Suitably, the battery cells are of lithium-ion type, but other types may also be used. The number of battery cells per battery pack may be in the range of 50 to 500 cells.

The energy storage system 4 also comprises a sensor unit 6 which is arranged for measuring one or more predetermined parameters which are indicative of the state of operation of the battery pack 5. For example, the sensor unit 6 can be configured for measuring the cell voltage (V) of each battery cell as well as the voltage of the entire battery pack 5. Furthermore, the sensor unit 6 can be configured for measuring other parameters such as the battery current (I) or the temperature (T) of the battery pack 5. Other measured parameters are also possible within the scope of the invention.

Measurement data from the sensor unit 6 is transmitted to an electronic control unit 7 which is configured for controlling the electric energy storage system 4 and other relevant components during operation of the bus 1. As will be described in detail below, the electronic control unit 7 can also be configured for determining parameters indicating and controlling the condition or capacity of the battery pack 5, such as the state of charge (SOC), the state of health (SOH) and the state of energy (SOE) of the battery pack 5.

The electronic control unit 7 serves as a battery management unit which may include a microprocessor, microcontroller, programmable digital signal processor or another programmable device. Thus, the electronic control unit 7 comprises electronic circuits and connections (not shown) as will as processing circuitry (not shown) such that the electronic control unit 7 can communicate with different parts of the bus 1 such as the brakes, suspension, driveline, in particular an electrical engine, a clutch and a gearbox in order to at least partly operate the bus 1. The electronic control unit 7 may comprise modules in either hardware or software, or partially in hardware or software, and communicate using known transmission buses such a CAN-bus and/or wireless communication capabilities. The processing circuitry may be a general purpose processor or a specific processor. The electronic control unit 7 comprises a non-transitory memory for storing computer program code and data upon. Thus, the skilled addressee realizes that the electronic control unit 7 may be embodied by many different constructions.

According to the embodiment shown in FIG. 1, the energy storage system 4 is arranged on the roof of the bus 1. However, the invention is not limited to such an arrangement, i.e. the energy storage system can be arranged in other locations such as in the floor section of the bus 1. Also, even though this disclosure refers to a battery pack 5 used in a vehicle 1 in the form of a bus, it relates generally to controlling the status of a battery pack in any type of vehicle which is operated by means of at least an electric machine and which has an energy storage system comprising a battery pack with a number of battery cells.

During operation of the bus 1, the battery pack 5 will deliver the required electrical power to the electric machine 2, which in turn drives the rear axle 3. The manner in which an electric machine can be used for operating a vehicle is generally previously known and for this reason, it is not described in any greater detail here.

The bus 1 is equipped with a first electric connector element 8, suitably in the form of an electric connection socket which is mounted on an outside part of the bus 1. The first connector element 8 is arranged to be connected to a second electric connector element 9 in the form of a charging cable which is provided with a plug 9a which can be electrically connected to the first connector element 8 and which is configured for conducting an electric charging current at a certain voltage. The second electric connector element 9 forms part of an external power supply 10, which suitably is connected to an AC grid system as represented by a charging post as shown in FIG. 1. In this manner, the battery pack 5 can be supplied with an electrical current via the connector elements 8, 9. More precisely, the electric current is fed to an on-board charging unit 11 which is connected to the battery pack 5 for charging thereof. The control unit 7 is configured for controlling the charging procedure by means of a connection to the on-board charging unit 11. Also, a conversion of AC current to DC current suitable for the battery pack 5 can be provided either in the external power supply 10 or in the on-board charging unit 11, According to an embodiment, charging of the battery pack 5 can take place while the bus 1 is standing still, i.e. either at a charging station at a bus terminal or at a bus stop or a similar position. It should be noted that other types of processes can be implemented for charging the battery pack 5 than shown in FIG. 1. For example, charging of the battery pack 5 can be implemented by means of a connector element in the form of a pantograph which is arranged on the roof of the vehicle and which is connected to an external power supply via an overhead wire.

According to a yet further embodiment, the charging process can be implemented by means of a current conducting power rail which is arranged along a road surface. Such an arrangement is configured to cooperate with one or more current collectors of the vehicle which are movable and lowered towards the ground, and which may be configured to be connected with said current conducting power rail during operation of the vehicle.

An embodiment of the invention will now be described in greater detail with reference to FIG. 2, which is a simplified illustration of the energy storage system 4 and relevant components of the vehicle 1. It should be noted that all components shown in FIG. 1 are not shown in FIG. 2.

According to the embodiment, the energy storage system 4 comprises a battery pack 5 with a plurality of battery cells, symbolically represented by reference numerals 5a, 5b, 5c and being connected in series so as to provide an output battery voltage. The battery pack 5 contains a large number of battery cells, suitably in the magnitude of 50-500 cells, although the specific number may vary depending on the specifications of the energy storage system 4. According to the embodiment, the battery cells 5a, 5b, 5c are of the lithium-ion type, although the principles of the invention are equally applicable to other types of battery cells.

Also, although the embodiment comprises one single battery pack, it should be noted that the invention is also applicable in cases where two or more battery packs are combined in one single vehicle.

As mentioned above with reference to FIG. 1, the battery pack 5 is connected to an electric machine 2 and is configured for operating said electric machine 2, which in turn operates the vehicle in question. Furthermore, the battery pack 5 is connected to the on-board charging unit 11 so as to allow charging of the battery pack 5 when the charging unit 11 is connected to the external power supply 10. The external power supply 10 is typically configured for supplying a 400 V AC three-phase voltage. The charging unit 11 typically supplies a voltage of 700 V DC to the battery pack 5. However, alternative specifications are possible within the scope of the invention, such as an off-board charging unit.

Furthermore, the energy storage system 4 comprises the sensor unit 6 which is connected to the control unit 7. The sensor unit 6 is configured for determining certain parameters associated with the battery pack 5. According to an embodiment, the sensor unit 6 is configured for measuring the cell voltage (V) of each battery cell and the voltage of the entire battery pack 5, and also for transmitting information related to measurements to the control unit 7. Furthermore, the sensor unit 6 is configured for measuring the battery current (I), i.e. the current flowing through the series-connected battery cells 5a, 5b, 5c, as well as the temperature (T) of the battery pack 5. The measured temperature value represents the temperature at a suitable location within the battery pack 5, alternatively an average of several temperature values being measured at different locations within the battery pack 5.

The above-mentioned measurements of the current, voltage and temperature are generated by means of suitable sensor devices which are not shown in detail in the drawings. Furthermore, a purpose of the control unit 7 within the context of the invention is to serve as a battery management unit which controls the operation of the battery pack 5 and which also monitors the condition of the battery pack 5 with regard to certain parameters such as its state of charge (SOC), state of health (SOH) and similar parameters. The control unit 7 is also configured to control the charging procedure of the battery pack 5.

In order to determine a value of the state of charge (SOC) of the battery pack 5, the control unit 7 comprises a state of charge estimation module 7a. According to an embodiment, a measurement of the voltage of each battery cell 5a, 5b, 5c, i.e. resulting in a measured voltage value $V_{meas}$, and a measurement of the battery current of the battery pack 5, i.e. resulting in a measured current value $I_{meas}$, can be provided by means of the sensor unit 6. As previously known, both such measurements can be used for determining the state of charge (SOC) of the battery pack 5 and its battery cells. Consequently, the sensor unit 6 is configured for transmitting information related to measurements of the voltage V and battery current I to the control unit 7. Also, according to an embodiment, the sensor unit 6 is also configured for measuring the temperature (T) of the battery pack 5. A temperature value can be used to improve the accuracy of a process for determining the state of charge.

In summary, the state of charge estimation module 7a is configured to determine the state of charge (SOC) of the battery pack 4 based on measurements provided by the sensor unit 6.

Suitably, the control unit 7 can also be configured to implement a battery cell balancing process, which is previously known as such and which is required when certain parameters such as the voltage of different battery cells 5a, 5b, 5c in the battery pack 5 differ between cells during the course of time. If cell balancing is not carried out, this may result in degraded battery properties. As will be described in further detail below, the control unit 7 comprises a cell balancing module 7b which is arranged for balancing the cells 5a, 5b, 5c of the battery pack 5. In order to accomplish this, estimated values of the SOC of each battery cell will be provided by the SOC estimation module 7a, as explained above, and used to determine whether a cell balancing process should be initiated by the control unit 7.

Figure 2:
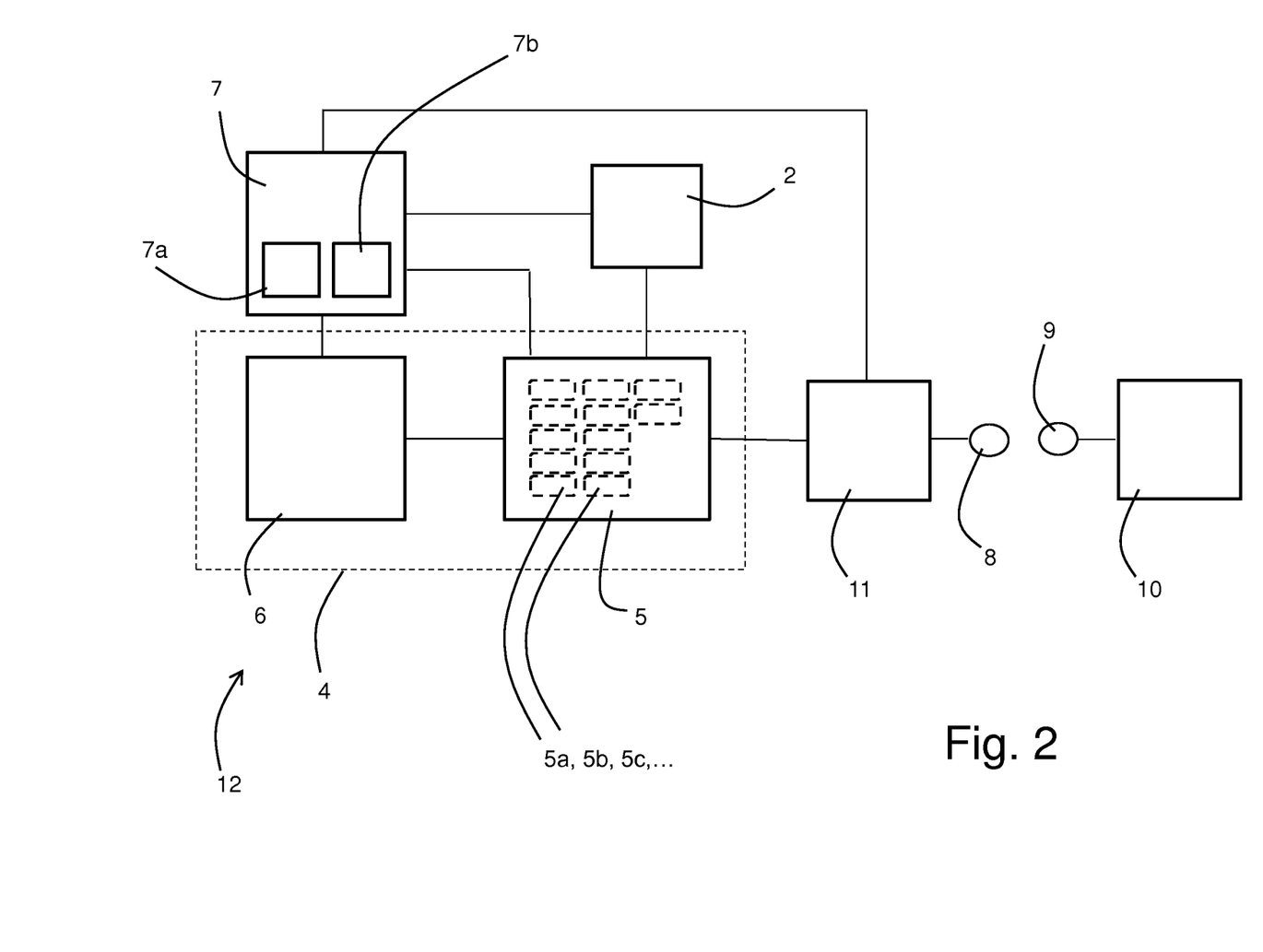
FIG. 2 is a schematical view of a battery management system for a vehicle, in accordance with an embodiment of the invention.

FIG. 2 also shows in a schematical manner the first connector 8, forming part of the vehicle, and the second connector 9, forming part of the external power supply 10. Consequently, the battery pack 5, the sensor unit 6 and the control unit 7 together constitute a battery management system 12 which is arranged for monitoring the status of the battery cells 5a, 5b, 5c and for providing the cell balancing procedure.

Figure 3:
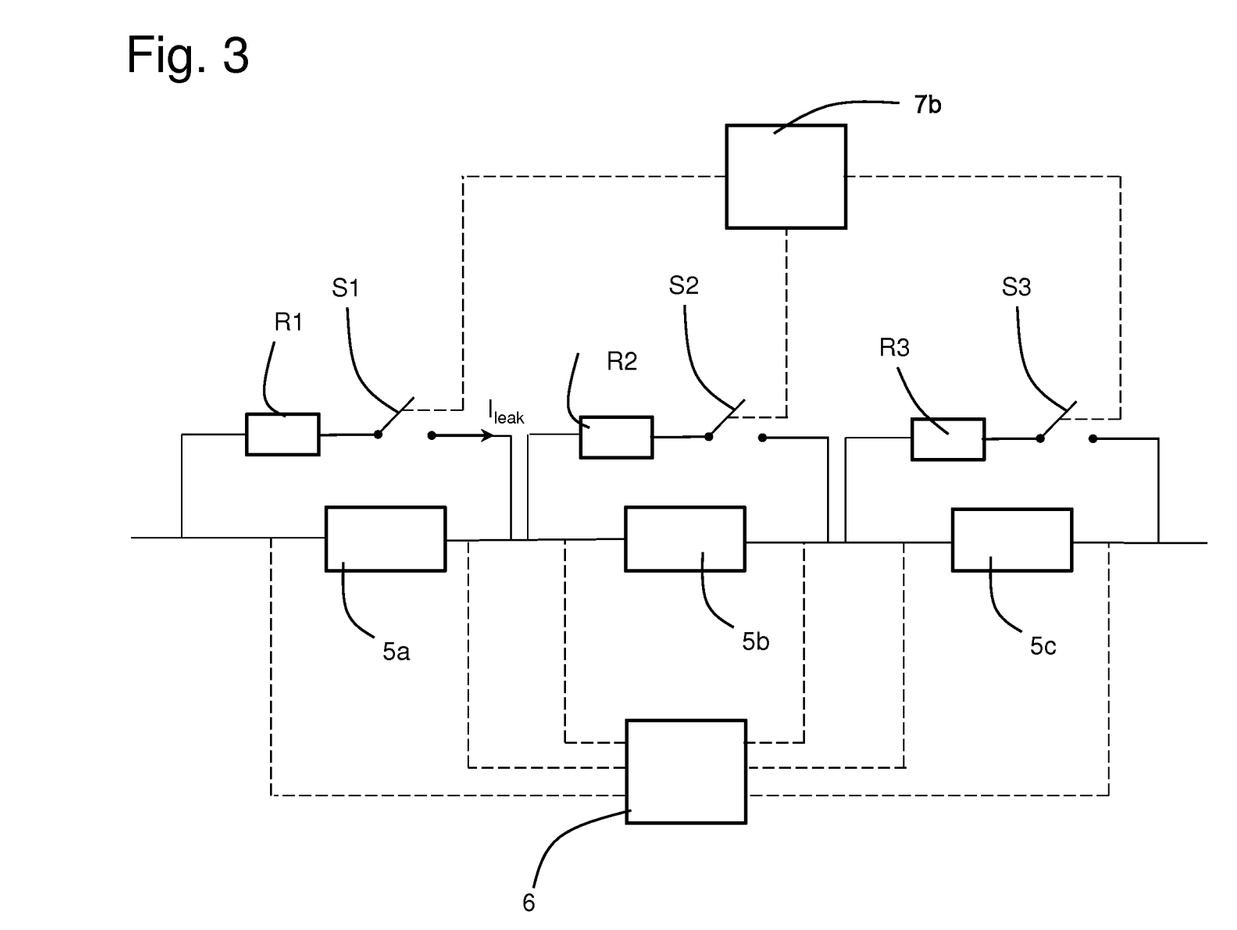
FIG. 3 is a schematic view of an exemplary embodiment disclosing a small number of battery cells being configured for cell balancing.

As will be described in greater detail below, the invention relates to a method for balancing the battery pack 5. For this reason, there is shown in FIG. 3 a number of battery cells 5a, 5b, 5c forming part of the battery pack 5 and being configured for implementing a cell balancing process. The main reason for implementing a cell balancing process is to improve the general level of performance and properties of the battery pack 5. The principles of the cell balancing will now be described primarily with reference to FIG. 3.

FIG. 3 discloses only three battery cells 5a, 5b, 5c. However, it is obvious that a battery pack 5 to be used for example in a vehicle comprises a large number of cells, typically in the magnitude of 50-500 cells, and that all cells are designed in a similar manner as those shown in FIG. 3. For simplicity, however, FIG. 3 only shows three such battery cells.

A first battery cell 5a shown in FIG. 3 is arranged with a resistor R1 coupled in parallel with the battery cell C1. The purpose of the resistor R1 is to allow an electric current to pass through said resistor R1 during a process of cell balancing. In order to accomplish this, the resistor R1 is coupled in series with a controllable switch S1. As indicated in FIG. 3, the battery cells 5a, 5b, 5c are connected to the sensor unit 6, for measuring the voltage across each battery cell 5a, 5b, 5c. Furthermore, the switch S1 is connected to the cell balancing unit 7b which forms part of the electronic control unit 7 (also shown in FIG. 2). In this manner, the switch S1 can be set either in a closed, i.e. activated, state in which current may pass through the resistor R1, or in an open, i.e. inactivated, state in which no current may pass through the resistor R1. A leak current $i_{leak}$ is consequently generated in the event that the switch S1 is set in its closed state. For this reason, the resistor R1 can be referred to as a "leak resistor". As explained initially, during cell balancing, one or more suitable switches are closed in order to improving the total cell balance of the battery pack.

The remaining battery cells, i.e. the cells 5b, 5c in FIG. 3 and also all the other cells of the battery pack 5 which are not shown as such in FIG. 3, are configured in the same manner as the described cell 5a, i.e. with a circuit including a resistor R2, R3 and a controllable switch S2, S3 which is coupled in parallel with the associated battery cell. Consequently, each battery cell may give rise to a leak current $i_{leak}$ in the event that a corresponding switch S is closed.

All the controllable switches S1, S2, S3 are connected to the cell balancing module 7b which forms part of the control unit 7. Also, each switch S1, S2, S3 is set in its open or closed state depending on certain operating conditions relating to a cell balancing procedure, as will be described below.

According to an embodiment, the cell balancing process is based on the principle that each switch S1-S3 can be closed or opened in order to discharge the corresponding battery cell 5a, 5b, 5c, i.e. so that a leak current $i_{leak}$ flows through the associated resistor R1, R2, R3 upon closing of the switch. The operation of the switches S1-S3 is controlled depending on the state of balance (SOB) of the battery cell 5a, 5b, 5c, i.e. which is determined by comparing the difference between state of charge (SOC) values of different battery cells 5a, 5b, 5c. As mentioned above, the state of charge values can be determined in the state of charge estimation module 7a (see FIG. 2) and be forwarded to the cell balancing unit 7b. In this manner, the state of charge (SOC) of the battery cells 5a, 5b, 5c can be used in the control unit 7 for deciding if a cell balancing process should be initiated.

By discharging a particular battery cell in this manner, said battery cell will be forced to change its state of charge (SOC). By balancing for example those cells which have considerably higher SOC than the remaining cells, or alternatively those cells which have a considerably higher cell voltage than the remaining cells, the entire battery pack 5 will be brought to a condition involving a higher level of cell balancing, i.e. a lower state of balance (SOB) of the battery pack 5. As mentioned, this leads to an improved performance of the battery pack 5.

The above described hardware including the cell balancing module 7b is configured for managing the leak current of all battery cells which are involved in the cell balancing process. The leak current $i_{leak}$ only occurs when a corresponding switch S is in its closed position. As mentioned, this is initiated depending on the value of the state of balance (SOB).

According to previously known technology, a cell balancing process is conventionally based on information related to present-time parameters such as the present state of balance (SOB). However, in contrast to previously known technology, the present invention uses so-called "look-ahead" information, i.e. information related to future values of certain parameters related to the use of the battery pack 5 and the vehicle 1. More precisely, the control unit 7 is configured for receiving information related to the expected use of the vehicle 1 up to a prediction horizon. The term "prediction horizon" refers to a future point in time in which the vehicle 1 is in use and which is relevant with regard to the cell balancing process. By utilizing information related to the use of the vehicle 1, and in particular use of the battery pack 5, during a time period which extends up to the prediction horizon, it has been found that a more accurate and optimized cell balancing process can be achieved.

In most practical situations, the prediction horizon is in the magnitude of 30-60 minutes ahead of the present time. However, the invention is not limited to such a value, but can be varied depending on the operation of the vehicle 1 and battery pack 5 and also the requirements for the cell balancing process. For example, the prediction horizon can be relatively long, in the magnitude of 2-3 hours' time, or can be relatively short, in the magnitude of 10-20 minutes.

According to an embodiment, a state of balance value is determined both at the current time (referred to as ($SOB_c$)) and at the end of the prediction horizon (referred to as $SOC_p$)). A state of balance (SOB) value defines how well balanced the battery pack 5 is. The lower state of balance value, the better the state of balance. The state of balance (SOB) at a given point in time (k) can be expressed as a difference between a maximum value of a parameter p and a minimum value of the parameter p at a given time, i.e.:

$$SOB(k)=\max(p(k))-\min(p(k))$$

where p(k) is a vector which according to the embodiment comprises state of charge (SOC) values of the battery cells 5a, 5b, 5c at the given point in time (k). By using state of charge values at the current time and at the prediction horizon, the state of balance (SOB) can be determined and then be used to control a cell balancing process. It should be noted that according to a further embodiment, the parameter p may correspond to another battery cell parameter such as the battery cell terminal voltage. In other words, the invention is not limited to the case in which the parameter p corresponds to the state of charge.

Consequently, according to an embodiment, the state of balance (SOB) can be defined as $$SOB=\max(SOC)-\min(SOC)$$

which means that the state of balance (SOB) is the difference between the highest and lowest state of charge (SOC) values for the battery cells 5a, 5b, 5c. Other definitions of the state of balance (SOB) can be equally applicable, such as:

$$SOB=\mu_{SOCmax}-\mu_{SOCmin}$$

where $\mu_{SOCmax}$ denotes the highest mean value of the state of charge for the battery cells, and $\mu_{SOCmin}$ denotes the lowest mean value of the state of charge for the battery cells. Since the state of charge may be a statistical variable, the mean of the statistical variable may be used to define the state of balance (SOB). Other alternatives include to use a normalized state of charge whereby the state of charge for each battery cell is normalized to the maximum state of charge of the battery cells ($SOC_{j, normalized}=SOC_j/SOC_{max}$), for each battery cell j, and the state of balance is thus in this case defined as:

$$SOB=(\max(SOC_{j, normalized})-\min(SOC_{j, normalized}))$$

Another possibility is to define the state of balance as the standard deviation of the distribution of state of charge of all the cells, i.e. $SOB=\sigma_{SOCall}$.

The state of balance may also be determined by considering the difference in open circuit voltage in a way similar to the above described definitions.

In order to obtain state of charge values at the prediction horizon, relevant information regarding the use of the vehicle needs to be obtained. Such information may for example include data from an onboard navigation system (not shown) providing information on which routes the vehicles have travelled, whether the vehicle 1 has been travelling in downslopes or upslopes, whether the vehicle 1 has been travelling on for example highways or other road types etc. Also, data related to fuel consumption, temperature, engine load and other parameters can be used for the purpose of determining the state of charge at the prediction horizon.

The gathered amount of data will be used for determining the drain of current from the battery pack 5 at the present time and also the expected drain of current from the battery pack 5 at the prediction horizon. This information can then be used to determine the state of charge within the prediction horizon, which in turn can be used to determine the present state of balance value ($SOB_c$), i.e. at the present time, and also the expected state of balance value ($SOB_p$) at the prediction horizon.

Based on the state of balance values ($SOB_c$, $SOB_p$), the battery cells 5a, 5b, 5c can be balanced in a manner such that the state of balance (SOB) and the use of the cell balancing process is optimized with regard to the energy usage of the battery pack 5. More precisely, the cell balancing involves balancing the battery cells 5a, 5b, 5c by means of the above-mentioned controllable switches S1, S2, S3. Furthermore, the battery cells 5a, 5b, 5c are balanced in a manner so as to optimize the use of these switches S1, S2, S3 with regard to the total power loss in the resistors R1, R2, R3 during the balancing step. This optimization is obtained by calculating the time during which each switch S1, S2, S3 is activated. By minimizing the total time during which all the switches are activated, a measure of a minimized total power loss during the cell balancing can be obtained. In other words, the time during which the switches are activated can be regarded as equivalent to the power loss during the cell balancing. In this manner, the total energy usage can be kept as low as possible during the cell balancing process.

A feature of this disclosure is that a prediction of the future use of the vehicle 1 is made in order to determine in advance, i.e. up to the prediction horizon, the amount of current which will be drawn from the battery pack 5. The cell balancing process is then optimized based on information related to the future use of the vehicle 1 as provided by the control unit 7, and consequently the future use of the battery pack 5.

According to an embodiment, the cell balancing process involves a control vector (U) having a number of components, each of which corresponds to a switch. Each component has a value between 0 and 1, being 0 when a switch is open and 1 when a switch is closed. Also, a value between 0 and 1 indicates the average value of the positions of a particular switch during a certain time, i.e. corresponding to control by means of pulse-width modulation. This means that each component can be a real number. Consequently, the control vector (U) indicates the state of each one of said switches S1, S2, S3. As mentioned, the embodiment is based on the principle that the cell balancing process is optimized by minimizing the power losses as a function of the control vector (U), by minimizing the time during which the switches S1, S2, S3 are activated.

According to a further embodiment, the control vector can be in the form of a binary vector, meaning that each component of the vector has a value of only 0 or 1, i.e. being 0 when a switch is open and 1 when a switch is closed.

More precisely, the optimization problem can be solved repeatedly through the use of the following function:

$$\min_{U(0)...U(N-1)} \sum_{k=1}^{N-1} q_1 \cdot SOB(k) + \sum_{k=0}^{N-1} q_2 \cdot U(k) + q_3 \cdot SOB(N)$$

where U is the above-mentioned control vector for a given point in time (k), where N is a point in time corresponding to the prediction horizon and where SOB(k) is the state of balance at a given point in time (k).

Furthermore, $q_1$ is the cost that penalizes the state of balance (SOB), wherein the state of balance at time (k) is defined as SOB(k)=max(p(k))−min(p(k)), where p(k) is a vector with the state of charge (SOC) values of the battery cells 5a, 5b, 5c at a given time (k). Furthermore, $q_2$ is the cost that penalizes the activity of the switches and $q_3$ is the cost that penalizes the state of balance (SOB) at the end of the prediction horizon.

It should be noted that alternative definitions of the state of balance may apply, as described above.

The above-mentioned optimization problem could be solved in a manner wherein it is stated as a linear programming problem (i.e. linear costs). According to known technology, there exist several efficient linear programming solvers for use in an online application in a vehicle. According to an embodiment, the cell balancing problem can be formulated as:

$$\min_{U(0)...U(N-1)} \sum_{k=1}^{N-1} q_1 \cdot (\alpha(k) - \beta(k)) + \sum_{k=0}^{N-1} q_2 \cdot U(k) +$$

-continued $$q_3 \cdot (\alpha(N) - \beta(N)) + \sum_{k=0}^{N} (q_4 \cdot \epsilon(k) + q_5 \cdot \delta(k))$$

s.t. $SOC_j(k+1) = SOC_j(k) -$ $\frac{\eta_j}{Q_j} \cdot \Delta t \cdot (i(k) + u_j(k) \cdot i_{leak,j}(k))$, $1 \le j \le m, 0 \le k \le N-1$ $\alpha(k) \ge SOC_j(k)$, $\quad 1 \le j \le m, 1 \le k \le N$
$\beta(k) \le SOC_j(k)$, $\quad 1 \le j \le m, 1 \le k \le N$
$0 \le u_j(k) \le 1$, $\quad 1 \le j \le m, 1 \le k \le N$
$\alpha(k) \le SOC_{lim,max} + \epsilon(k)$ $\quad 1 \le k \le N$
$\epsilon(k) \ge 0$ $\quad 1 \le k \le N$
$SOC_{lim,min} \le \beta(k) + \delta(k)$ $\quad 1 \le k \le N$
$\delta(k) \ge 0$ $\quad 1 \le k \le N$ where $SOC_j(k)$ corresponds to the state of charge of a battery cell k at time k; where $\rho_j$ corresponds to the coloumbic efficiency of the battery cell j; where $Q_j$ corresponds to the capacity of the battery cell j; where $i_{leak}$ the leakage (balancing) current of the cell j; where $u_j(k)$ is the battery cell voltage of cell j at time k; and where i(k) is the battery cell current predicted at time k, i.e. within the prediction horizon N. As mentioned above, the battery cell current i(k) can be determined based on data related to the future use of the vehicle 1 and the battery pack 5, i.e. data which can be used for determining the current drain from the battery pack 5 at the present time and the expected current drain from the battery pack 5 at the prediction horizon.

Figure 4:
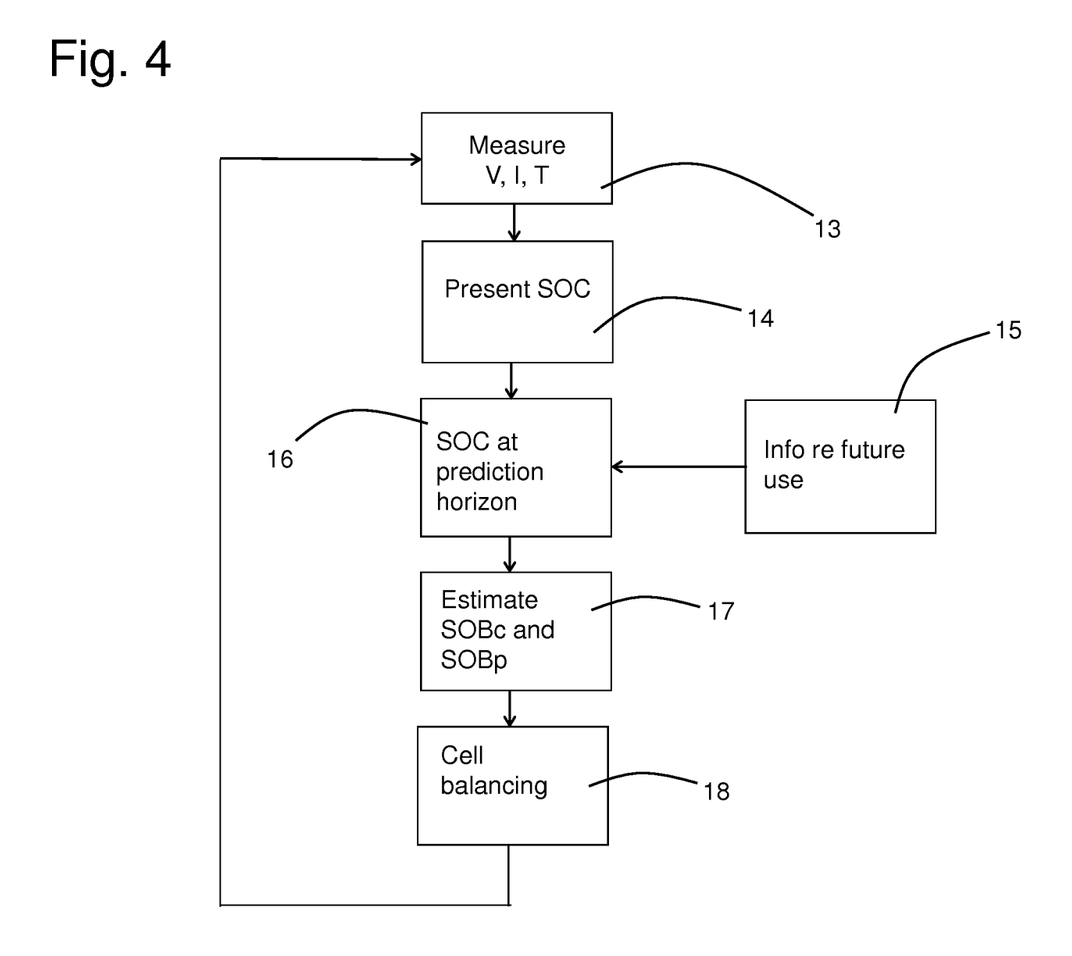
FIG. 4 is a flowchart illustrating the operation of an embodiment of the invention.

The invention will now be described with reference to FIG. 4, which is a flowchart illustrating a cell balancing process. Initially, it is assumed that at least the voltage V across each battery cell 5a, 5b, 5c and the battery current I are provided by means of the sensor unit 6, as indicated by means of reference numeral 13 in FIG. 4. Suitably, the temperature of the battery pack 5 is also measured. The control unit 7 will then determine the present state of charge SOC based on at least the battery cell voltages and the battery current (reference numeral 14). According to an embodiment, measurements of all three parameters V, I and T are used for determining the state of charge.

Also, the control unit 7 will provide information related to the future, expected use of the vehicle 1 and in particular also the battery pack 5 (reference numeral 15), as explained in detail above. This information extends up to a given prediction horizon, which corresponds to a time period which can be approximately 30-60 minutes ahead, but which also may vary depending on circumstances. In this manner, the state of charge SOC for each battery cell 5a, 5b, 5c can be determined also at the prediction horizon (reference numeral 16). Based on the state of charge information, a current state of balance value ($SOB_c$) an expected state of balance value ($SOB_p$) at the end of the prediction horizon can be determined (reference numeral 17).

Furthermore, a cell balancing process is initiated based on the state of balance value ($SOB_c$) at the current time and the expected state of balance value ($SOB_p$) at the end of the prediction horizon (reference numeral 18). The cell balancing is carried out in a manner so that the state of balance (SOB) and the use of the cell balancing process is optimized with regard to the energy usage of the battery pack 5, in a manner as described above. During this process, the switches S1, S2, S3 (see FIG. 3) are opened or closed in accordance with the results of the optimization process, i.e. in order to obtain a minimized energy usage and minimized power losses during a cell balancing process as described above.

It is to be understood that the present invention is not limited to the embodiments described above and illustrated in the drawings; rather, the skilled person will recognize that many changes and modifications may be made within the scope of the appended claims.

The invention claimed is:

1. A method for balancing a battery pack (5) comprising a plurality of battery cells (5a, 5b, 5c) for an electric vehicle; said method comprising:
    determining the state of charge (SOC) for each of said battery cells (5a, 5b, 5c);
    receiving information related to the expected use of the electric vehicle to a prediction horizon; and
    determining a state of balance value ($SOB_c$) at the current time and an expected state of balance value ($SOB_p$) at the end of the prediction horizon; and
    balancing the battery cells (5a, 5b, 5c) based on the state of balance value ($SOB_c$) at the current time and the expected state of balance value ($SOB_p$) at the end of said prediction horizon, such that the state of balance (SOB) and the use of the cell balancing process is optimized so as to minimize the energy usage of the battery pack (5).

2. A method according to claim 1, characterized by the further steps of:
    balancing said battery cells (5a, 5b, 5c) by means of controllable switches (S1, S2, S3) being associated with each battery cell (5a, 5b, 5c), each switch (S1, S2, S3) being configured for connecting a resistor (R1, R2, R3) in parallel with each battery cell (5a, 5b, 5c); and
    balancing said battery cells (5a, 5b, 5c) in a manner so as to optimize the use of the switches (S1, S2, S3) with regard to the power losses in said resistors during said balancing step.

3. A method according to claim 2, characterized by the further step of:
    optimizing the use of the switches (S1, S2, S3) by minimizing the time during which the switches (S1, S2, S3) are activated, said time being equivalent to the power loss during the cell balancing.

4. A method according to claim 2, characterized by the further step of:
    defining a control vector (U) which indicates the state of a corresponding one of said switches; and
    optimizing said cell balancing by minimizing the power losses as a function of said control vector (U).

5. A method according to claim 4, characterized by the further step of:
    defining said control vector (U) with a number of components, each of which corresponds to one of said switches;
    each of said components having a value between 0 and 1, being 0 when a switch is open and 1 when a switch is closed and wherein and a value between 0 and 1 indicates an average value of the positions of a corresponding switch during a certain time period.

6. A method according to claim 1, characterized by the further step of:
    determining the state of charge (SOC) of the battery cells (5a, 5b, 5c) using at least measurements of the voltage of each cell (5a, 5b, 5c), the battery pack current and the temperature of each cell (5a, 5b, 5c).

7. A method according to claim 6, characterized by the further step of:
    balancing the battery cells (5a, 5b, 5c) based on also at least the cell capacity and the internal resistance of each battery cell (5a, 5b, 5c).

8. An arrangement for balancing a battery pack (5) comprising a plurality of battery cells (5a, 5b, 5c) for an electric vehicle; said arrangement comprising a battery control unit (7) configured for determining the state of charge (SOC) for each of said battery cells (5a, 5b, 5c), for receiving information related to the expected use of the electric vehicle to a prediction horizon, and for determining a state of balance value ($SOB_c$) at the current time and an expected state of balance value ($SOB_p$) at the end of the prediction horizon; characterized in that said battery control unit (7) is configured for balancing the battery cells (5a, 5b, 5c) based on the state of balance value ($SOB_c$) at the current time and the expected state of balance value ($SOB_p$) at the end of said prediction horizon, such that the state of balance (SOB) and the use of the cell balancing process is optimized so as to minimize the energy usage of the battery pack (5).

9. An arrangement according to claim 8, characterized in that each battery cell (5a, 5b, 5c) is associated with a controllable switch (S1, S2, S3) which is configured for connecting a resistor (R1, R2, R3) in parallel with each battery cell (5a, 5b, 5c); wherein the control unit (7) is configured for balancing said battery cells (5a, 5b, 5c) in a manner so as to optimize the use of the switches (S1, S2, S3) with regard to the power losses in said resistors during said balancing step.

10. A vehicle comprising an arrangement according to claim 9.

11. A computer program comprising program code means for performing the steps of claim 1 when said program is run on a computer.

12. A computer readable medium carrying a computer program comprising program code means for performing the steps of claim 1 when said program product is run on a computer.

13. A control unit (7) for balancing a battery pack (5) and being configured to perform the steps of the method according to claim 1.

* * * * *